United States Patent
Tripathi et al.

(10) Patent No.: US 10,277,207 B1
(45) Date of Patent: Apr. 30, 2019

(54) LOW VOLTAGE, MASTER-SLAVE FLIP-FLOP

(71) Applicant: STMicroelectronics International N.V., Schiphol (NL)

(72) Inventors: Alok Kumar Tripathi, Ghaziabad (IN); Amit Verma, Sadhaura (IN); Anuj Grover, New Delhi (IN); Deepak Kumar Bihani, Noida (IN); Tanmoy Roy, Greater Noida (IN); Tanuj Agrawal, Noida (IN)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 0 days.

(21) Appl. No.: 15/892,308

(22) Filed: Feb. 8, 2018

(51) Int. Cl.
*H03K 3/00* (2006.01)
*H03K 3/3562* (2006.01)
*G11C 11/412* (2006.01)

(52) U.S. Cl.
CPC ........ *H03K 3/35625* (2013.01); *G11C 11/412* (2013.01)

(58) Field of Classification Search
CPC ......... H03K 3/35625; H03K 3/356104; H03K 21/00; G11C 11/412
USPC ................................................. 327/200–203
See application file for complete search history.

(56) References Cited

U.S. PATENT DOCUMENTS

| | | | | |
|---|---|---|---|---|
| 8,339,172 B2* | 12/2012 | Firmin | ................. | H03K 3/0372 327/202 |
| 2007/0035338 A1* | 2/2007 | Jung | .................... | H03K 3/0372 327/199 |
| 2011/0248759 A1* | 10/2011 | Chi | .................. | H03K 3/356008 327/202 |
| 2015/0213846 A1* | 7/2015 | Nakagawa | ............. | G11C 5/148 365/72 |
| 2015/0358004 A1* | 12/2015 | Shirai | .............. | H03K 3/356104 327/115 |

\* cited by examiner

*Primary Examiner* — Dinh T Le
(74) *Attorney, Agent, or Firm* — Seed IP Law Group LLP

(57) ABSTRACT

The present disclosure is directed to a master-slave flip-flop memory circuit having a partial pass gate transistor at the input of the master latch. The partial pass gate transistor includes a pull-up clock enabled transistor for selectively coupling a high output of a test switch to the input of the master latch. The input of the master latch is also directly coupled to a low output of the test switch around the partial pass gate. In addition, a revised circuit layout is provided in which the master latch has three inverters. A first inverter is coupled to the input of the master latch. Second and third inverters are coupled to an output of the first inverter, with the second inverter having an output coupled to the input of the first inverter, and the third inverter having an output coupled to an output of the master latch. The first and second inverters are clock enabled, and the third inverter is reset enabled.

16 Claims, 6 Drawing Sheets

LOW VOLTAGE, MASTER-SLAVE FLIP-FLOP

BACKGROUND

Technical Field

The present disclosure is directed to a master-slave flip-flop memory circuit, and in particular, to an arrangement of transistors to improve low voltage nominal hold and variability characteristics.

Description of the Related Art

Memory devices are common components in digital circuits. One type of memory is static random access memory (SRAM). SRAM cells use a latching circuit for each memory cell to preserve the data value over time without the use of a refreshing circuit. An output of a single D type latching circuit can be erratic during switching from the various inputs undergoing transitions. Thus one solution is to cascade two D type latches together. In this configuration, the first D type latch latches the desired value at a first time while the second D type latch continues to output a previously stored value. At a second time, the first D type latch outputs the previously received value to the second D type latch. This allows the inputs to stabilize, possibly resulting in less overall output variability of the memory circuit.

Power consumption of a circuit, including memory circuits, is a function of switching speed. Power equals current multiplied by voltage. As switching speed increases, more current flows through the circuit and power consumption increases. As power consumption increases, the circuit becomes more susceptible to thermal failure from the heat generated as power is dissipated by the circuit. Thermal failure can result in erratic electrical signal behavior, spurious signals appearing in the circuit, or from component failure. To try to prevent thermal failure during operation, circuit designs may decrease the source voltage. An unintended consequence of reduced source voltage is that transistor behavior can become more erratic as the threshold voltage of a transistor approaches the overall source voltage of the circuit.

BRIEF SUMMARY

The present disclosure is directed to a transistor layout that improves low voltage nominal hold and variability in a master-slave flip-flop memory circuit without increasing circuit area or dynamic power consumption.

The present disclosure is directed to a master-slave flip-flop memory circuit with a re-architectured transistor layout that improves low voltage nominal hold and variability characteristics without increasing circuit area or dynamic power requirements. The circuit reduces the number of transistors in the nominal hold critical path by coupling an input of the master latch to a low output of the test switch around a partial pass gate. In addition, a first inverter is coupled to the input of the master latch with second and third inverters being coupled to an output of the first inverter. The second inverter has an output coupled to the input of the first inverter and the third inverter has an output coupled to an output of the master latch. The first and second inverters are clock enabled, and the third inverter is reset enabled, such that clock and reset signals are not inverted within the master latch.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Specific embodiments of transistor layouts are described herein; however, the present disclosure and the reference to certain arrangements, dimensions, and details and ordering of processing steps are exemplary, and should not be limited to those shown. Reference to coupling of components refers to embodiments in which the components are directly coupled together with a connector and to embodiments in which the components are coupled together through another component.

Figure 1:
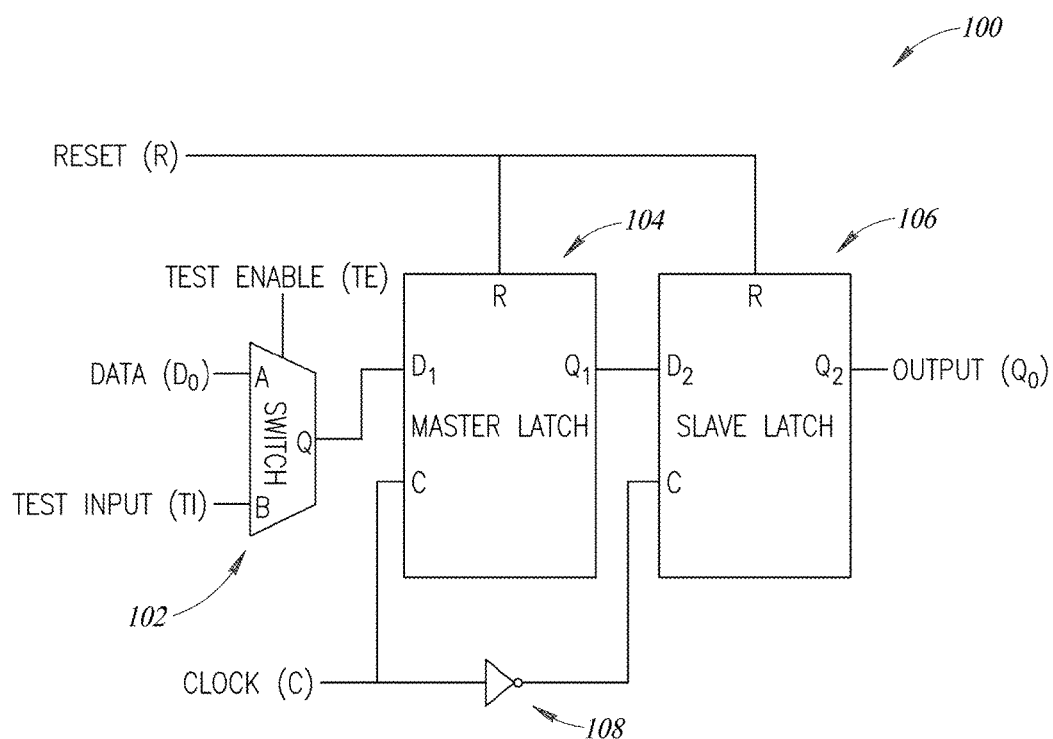
FIG. 1 is a high-level block diagram of a master-slave flip-flop memory circuit.

FIG. 1 is a high-level block diagram of a master-slave flip-flop 100 memory circuit, according to one embodiment. The master-slave flip-flop 100 has five inputs and one output. The inputs include a data signal $D_0$, a test input signal TI, a test enable signal TE, a clock signal C, and a reset signal R. The output is a data output $Q_0$. Each of the inputs and output are binary digital signals, with either a high value or a low value corresponding to a high power signal and a lower power signal provided to the master-slave flip-flop 100. The high value can be represented with a "1" and the low value can be represented with a "0", without those values corresponding to any specific power values. The master-slave flip-flop 100 receives and stores the data signal $D_0$ and outputs the data output $Q_0$. The storage and output of signals is controlled by the clock signal C. Separately, the master-slave flip-flop 100 can output the test input signal TI over the data output $Q_0$ when the test enable signal TE enables the test circuit.

To implement the above functionality, the master-slave flip-flop 100 implements a type of SRAM in which a test switch 102 selects an input into the master-slave flip-flop 100 and a master latch 104 is cascaded with a slave latch 106, the slave latch 106 receiving an inverted clock signal from an inverter 108. The test switch 102 includes a multiplexor that selects between the data signal $D_0$ at a first input A and the test input signal TI and a second input B. The multiplexor is controlled by the test enable signal TE to control which of the two inputs A, B is passed to an output Q of the test switch 102. In other embodiments, other types of switches may be used for the test switch 102.

The output Q of the test switch 102 is provided to a data input $D_1$ of the master latch 104. The master latch 104 also receives the reset signal R and the clock signal C. The master latch 104 outputs a data output $Q_1$. In some embodiments, the master latch 104 is a D type latch that has a truth table as depicted in Table 1 below. As depicted in the truth table, a data output $Q_n$ of the D type latch is affected by four parameters, the value at a data input D, the value at the clock signal C, the value at the reset signal R, and the previous data output $Q_{n-1}$. If the reset signal R is 0, then the data output $Q_n$ is 1, regardless of the values on the other inputs. This set of conditions can be referred to as the reset or clearing phase. If the reset signal R is 1 and the clock is 0, then the data output $Q_n$ is equal to the value at the data input D, regardless of the previous data output $Q_{n-1}$. This set of conditions can be referred to as the set or setup phase. If the reset signal R is 1 and the clock signal C is 1, then the data output $Q_n$ is equal to the value of the previous data output $Q_{n-1}$, regardless of the value at the data input D. This set of conditions can be referred to as the hold or store phase. Thus a value at the data input D can be received during the setup phase, stored and output during the hold phase, and reset during reset phase.

TABLE 1

| Conditions | | | | Output |
|---|---|---|---|---|
| D | C | R | $Q_{n-1}$ | $Q_n$ |
| — | — | 0 | — | 1 |
| D | 0 | 1 | — | D |
| — | 1 | 1 | Q | Q |

The data output $Q_1$ is provided to a data input $D_2$ of the slave latch 106. The slave latch 106 also receives the reset signal R and an inverted clock signal $\overline{C}$. The slave latch 106 outputs a data output $Q_2$ as data output $Q_0$ of the memory circuit 100. In some embodiments, the slave latch 106 is a D type latch that has a truth table as depicted in Table 1 above. The master-slave flip-flop 100 configuration has opposite clock level-triggered latches, which can aid in stabilization of the data output Q. In some embodiments, such as the embodiment shown in FIG. 4B, the slave latch 106 is opposite clock triggered by an output of the inverter 108. In other embodiments, such as the embodiment in FIG. 5, the slave flip-flop 106 is opposite clock level-triggered without the need of inverter 108.

Table 1 is an approximation or idealization of the performance of the D type latch. In real world implementations, there can be variability in the signal over time for any number of reasons. One reason for possible variations in the output of latches generally is that the timing of signals propagating through the circuit of the latch can cause unwanted behaviors. For example, a data input may arrive after a clock signal that was supposed to latch and hold the data value. Other issues may be that devices are running at clock speeds or power levels that introduce non-ideal behaviors from operating devices near their operational limits. As discussed above, design preferences are pushing devices to operate faster and at lower power levels.

A specific issue arises in flip-flops, in that high variations in hold time requirements occur under these conditions. In some previous designs, hold time performance may degrade such that rise or fall hold times become undesirable across a range of operating voltages. With severely degraded hold times, it may become impossible to write a 1 or 0 to the master-slave flip-flop 100. In some embodiments, negative hold times are desired.

One way to improve hold time is to remove nMOS devices from a critical hold path, the path the signal travels through the master-slave flip-flop 100 in holding a value. Compared to traditional designs, some of the disclosed embodiments do not include a second inverter in the clock signal to condition the clock signal for the master latch 104 and remove the nMOS transistor clock enabled pass-through gate at the input of the master latch 104. These embodiments will be discussed in further detail below. These embodiments may improve low voltage variability without increasing the circuit area or dynamic power.

Figure 2:
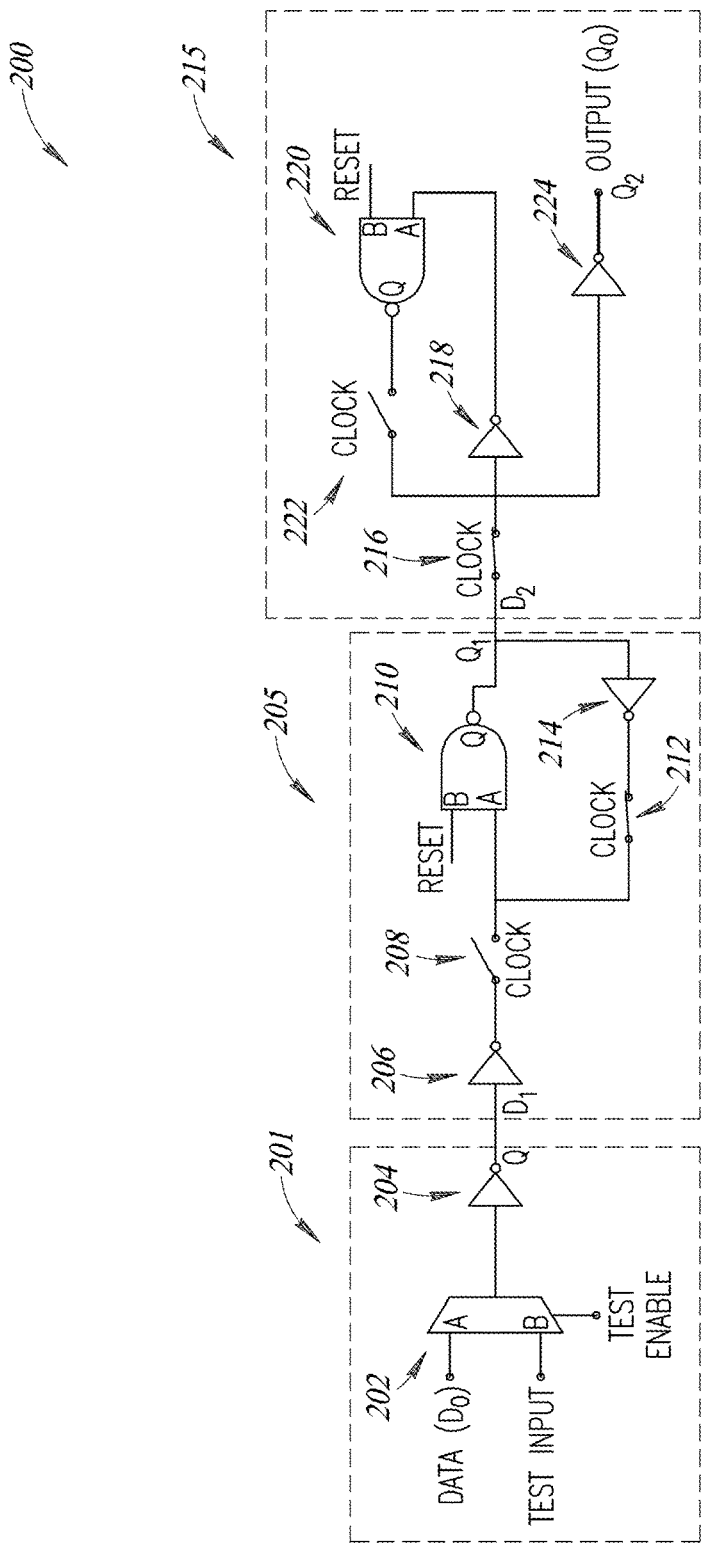
FIG. 2 is an intermediate-level block diagram of a master-slave flip-flop memory circuit.

FIG. 2 is an intermediate-level block diagram of a master-slave flip-flop 200 memory circuit. The master-slave flip-flop 200 includes a test switch 201, which selects an input into the master-slave flip-flop 200, and a master latch 205 cascaded with a slave latch 215. FIG. 2 depicts the various functional components of the master-slave flip-flop 200 with a level of detail between the block diagrams of FIG. 1 and the transistor diagrams of FIGS. 4-5.

The test switch 201 is shown having a multiplexer 202 that receives the data input D at a first input A and the test input TI at a second input B. The multiplexer 202 is controlled by the test enable signal TE. In one embodiment, when the test enable signal TE is 0, the multiplexer 202 couples the data input D to an output of the multiplexer 202, and when the test enable signal is 1, the multiplexer 202 couples the test input TI to an output of the multiplexer 202. In another embodiment, the values are reversed. The output of the multiplexer 202 is input into a first inverter 204. The inverted output of the first inverter 204 is an output Q of the test switch 201, which is also an input $D_1$ to the master latch 205. The first inverter 204 can represent a distinct physical component from the multiplexer 202, or can simply represent different functionality contained within a single physical component. In some embodiments, the order of the components of the test switch 201 are different than depicted, which may or may not impact the output of the test switch 201.

The master latch 205 receives the output Q from the test switch 201 at an inverter 206. The inverter 206 inverts the signal and supplies the inverted signal to a switch 208. The switch 208 can be any switch, and, in one embodiment, is an on/off switch that couples and uncouples the inverted output from the inverter 206 from the remaining components of the master latch 205. The switch 208 is shown in an open circuit state. The open/closed state of switch 208 is controlled by the clock signal C. In one embodiment, when the clock signal C is 1, the switch 208 is in an open state, and when the clock signal C is a 0, the switch 208 is in a closed state. Thus, in this embodiment, the test switch 201 is coupled to the master latch 205 when the clock signal C is 0 and uncoupled when the clock signal C is 1. In other embodiments, the values for controlling the switch 208 can be flipped.

An output of the switch 208 is coupled to a first input A of a NAND gate 210. The truth table for NAND gate 210 is provided in table 2, below. The NAND gate 210 has a second input B coupled to the reset signal R. Thus, in one embodiment, when the output of the switch 208 and the reset signal R are 1, an output Q of the NAND gate 210 is 0. Any other combination of inputs A, B to the NAND gate 210 in this embodiment results in an output Q of 1.

TABLE 2

| Conditions | | Output |
|---|---|---|
| A | B | Q |
| 0 | 0 | 1 |
| 0 | 1 | 1 |
| 1 | 0 | 1 |
| 1 | 1 | 0 |

The output Q of NAND gate 210 is also an output $Q_1$ of the master latch 205, which is input into a feedback loop that includes an inverter 214 and a switch 212. The inverter 214 receives the output Q of the NAND gate 210 and outputs an inverted signal to the switch 212. The switch 212 can be any switch, and, in one embodiment, is an on/off switch that couples and uncouples the inverted output from the inverter 214 from the first input A of the NAND gate 210. The switch 212 is shown in a closed circuit state. The open/closed state of switch 212 is controlled by the clock signal C. In one embodiment, when the clock signal C is a 1, the switch 212 is in a closed state, and when the clock signal C is a 0, the switch 212 is in an open state. Thus, in this embodiment, the feedback loop of the master latch 205 is a closed loop circuit when the clock signal C is 1 and is an open circuit when the clock signal C is 0. In other embodiments, the values for controlling the switch 212 can be flipped. In some embodiments, the switch 208 and the switch 212 respond to inverted inputs such that the clock signal C either causes the master latch 205 to be coupled to the test switch 201 or causes the master latch 205 to have a closed feedback loop.

The various components of the master latch 205 can represent distinct physical components from each other, or can simply represent different functionality contained within a single or combinations of multiple physical components. In some embodiments, the order of the components of the master latch 205 is different than depicted, which may or may not impact the output of the master latch 205.

The slave latch 215 receives the output signal Q from the master latch 205 at a switch 216, which is also an input $D_2$ of the master latch 205. The switch 216 can be any switch, and, in one embodiment, is an on/off switch that couples and uncouples the input of the slave latch 215 from a feedback loop of the slave latch 215. The switch 216 is shown in a closed circuit state. The open/closed state of switch 216 is controlled by the clock signal C. In one embodiment, when the clock signal C is a 1, the switch 216 is in a closed state, and when the clock signal C is a 0, the switch 216 is in an open state. Thus, in this embodiment, the slave latch 215 is coupled to the master latch 205 when the clock signal C is 1 and uncoupled when the clock signal C is 0. In other embodiments, the values for controlling the switch 216 can be flipped. In some embodiments, the switch 208 and the switch 216 respond to inverted inputs such that the clock signal C causes the slave latch 215 to be coupled to the master latch 205 only when the master latch 205 is decoupled from the test switch 201.

An output of the switch 216 is coupled to an input of an inverter 218. The inverter inverts the signal and provides an output to a first input A of a NAND gate 220. The NAND gate 220 can have a similar truth table as the NAND gate 210 depicted in Table 2. The NAND gate 220 has a second input B coupled to the reset signal R. Thus, in one embodiment, when the output of the inverter 218 and the reset signal R are 1, the output Q of the NAND gate 220 is 0. Any other combination of inputs A, B to the NAND gate 220 in this embodiment results in an output Q of 1.

The output Q of NAND gate 220 is coupled to a switch 222. The switch 222 can be any switch, and, in one embodiment, is an on/off switch that couples and uncouples the output Q of the NAND gate 210 from the input of the inverter 218 to form a feedback loop. The open/closed state of switch 222 is controlled by the clock signal C. In this embodiment, the feedback loop of the slave latch 215 is a closed loop circuit when the clock signal C is a 0, and is an open circuit when the clock signal C is a 1. In other embodiments, the values for controlling the switch 222 can be flipped. In some embodiments, the switch 216 and the switch 222 respond to inverted inputs such that the clock signal C either causes the slave latch 215 to be coupled to the master latch 205 or causes the slave latch 215 to have a closed feedback loop. Also, in some embodiments, the switch 212 and the switch 222 respond to inverted inputs such that the clock signal C causes the slave latch 215 to have a closed feedback loop when the master latch 205 has an open feedback loop, or the clock signal C causes the slave latch 215 to have an open feedback loop when the master latch 205 has a closed feedback loop.

The output of the switch 216 is also coupled to an inverter 224. The inverted signal output from the inverter 224 is an output $Q_2$ of the slave latch 215, which is also an output Q0 of the master-slave flip-flop 200. The various components of the slave latch 215 can represent distinct physical components from each other, or can simply represent different functionality contained within a single physical component or combinations of multiple physical components. In some embodiments, the order of the components of the slave latch 215 is different than depicted, which may or may not impact the output of the slave latch 215.

In some embodiments, the master-slave flip-flop 200 stores a value in master latch 205 from the test switch 201 on a first clock transition and stores a value in the slave latch 215 from the master latch 205 on a second clock transition. In some embodiments, the value to store is preserved at the output of each section, and, in other embodiments, the value to store is inverted at the output of some sections, but is preserved at the output of the master-slave flip-flop 200. And in yet other embodiments, the value to store is inverted at the output of some sections, including the output of the master-slave flip-flop 200.

Figure 3:
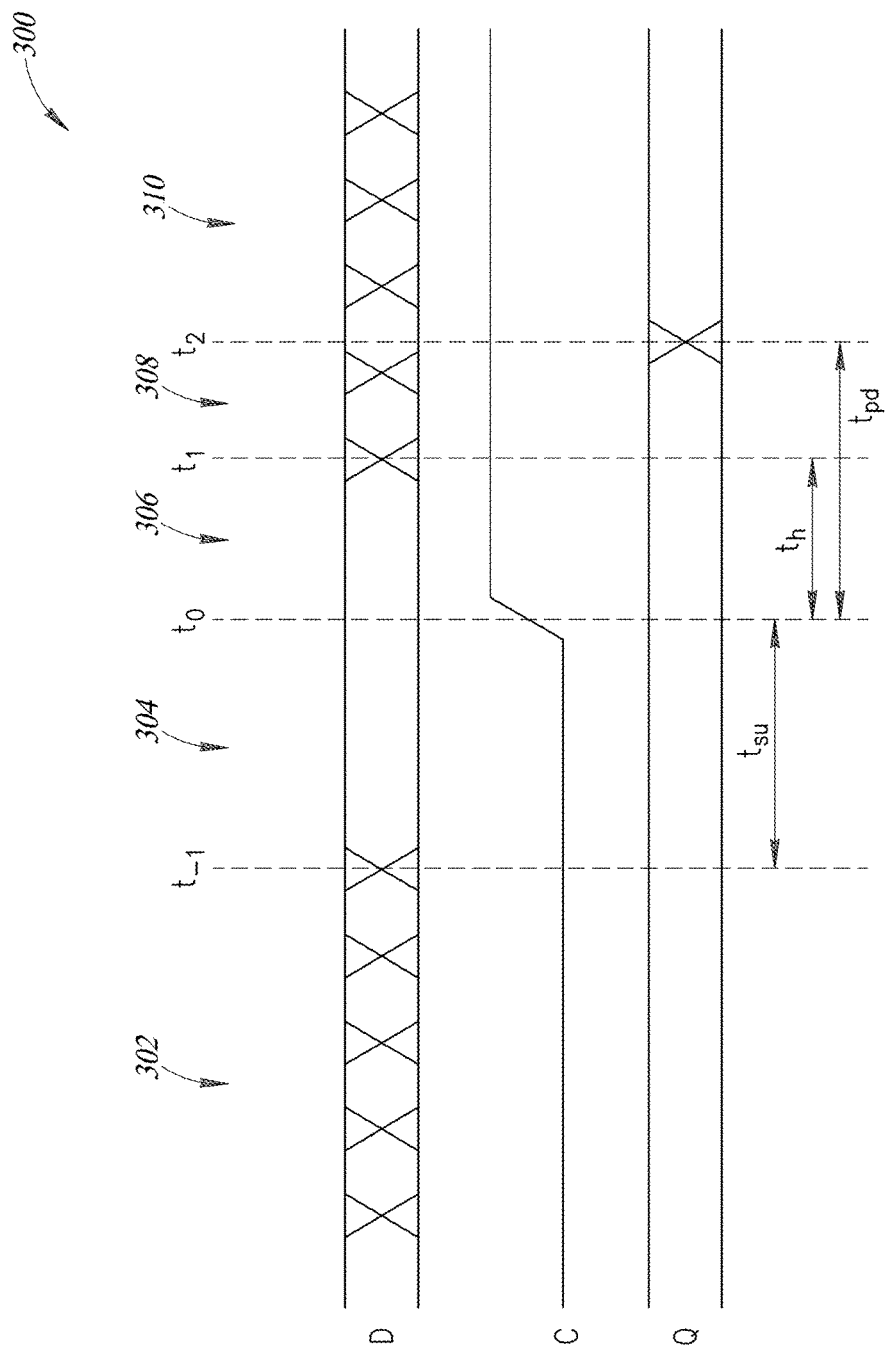
FIG. 3 is a timing diagram for a master-slave flip-flop memory circuit, according to one embodiment.

FIG. 3 is a timing diagram for a master-slave flip-flop memory circuit, according to one embodiment. The timing diagram is associated with a D flip-flop type of flip-flop. Some of the disclosed embodiments of transistor layouts improve upon the timing performance of master-slave flip-flops. For example, there can be a reduction in the window of time required to have a steady input to the master-slave flip-flop input to reliably capture the value. Alternatively, the relative start/stop times of the read window can be improved upon.

The timing diagram of FIG. 3 includes a timing plot 300 that has an x-axis value measured in time. Three distinct values are depicted on the timing plot 300, each having its own y-axis. The top subplot represents a value of a data input D to the D flip-flop. The middle subplot represents a value of a clock signal C to the D flip-flop. The bottom subplot represents a value of a data output Q to the D flip-flop. The value of each of these three signals can be 0, 1, or a transitional state between one of those values. Possible transitional states are depicted as the slanted lines.

The timing plot 300 is divided into five time periods. A first time period 302 occurs before $t_{-1}$. Time $t_{-1}$ is measured relative to the transition of the clock signal C. At this point the D flip-flop is not reading the data input D, and the data input D has time to change and propagate to the needed components of the D flip-flop. In other words, the D flip-flop has not latched the data input D yet, and a change in the data input D at the input of the D flip-flop during time period 302 will not affect the performance of the D flip-flop. Thus, various values for data input D are depicted in the timing plot 300 at time period 302, with each X representing possible transitions in the data input D value, from high to low or low to high, that do not otherwise affect the data output Q of the D flip-flop. Since the time period 302 is defined as an amount of time before the clock signal C, the clock signal is depicted as a single value of 0. In other embodiments, the clock signal C may be a constant 1, or include at least one transition. Data output Q is shown as a constant value of either 1 or 0, as in the period 302 the D flip-flop has latched the previous data input D and is outputting that value.

A second time period 304 of the timing plot 300 occurs after $t_{-1}$ and before $t_0$. Time $t_0$ is measured at the point in which clock signal C rises through the halfway point between 1 and 0. At $t_0$ the D flip-flop has been triggered to latch the value at the input of the D flip-flop. If the input data D is not stable during reading, the reliability of the D flip-flop can be sacrificed. Thus, a D flip-flop has a point in time relative to the rising edge of the clock signal C in which the data input D must be held constant to allow for accurate readings. The D flip-flop is latching a reliable steady-state signal of the data input D after $t_{-1}$. The time period 304 is defined as an amount of time before the clock signal C transitions to a 1 but after the data input D has to stabilize for a reliable reading. During the time period 304, the clock signal C is depicted as a single value of 0 until the end of the time period 304 when the clock signal C makes the first half of the transition to 1. In other embodiments, the clock signal may be a constant 1, or include at least one transition. Data output Q is shown as a constant value of either 1 or 0, as in the time period 304 the D flip-flop has latched the previous data input D and is outputting that value. Time $t_{-1}$ is also called setup time $t_{su}$, reflecting how this is the time relative to the rising edge of the clock signal C in which the D flip-flop input has to be set up and stable for a reliable reading. In some embodiments setup time $t_{su}$ is negative, reflecting that the setup time $t_{su}$ occurs earlier in time than the rising edge of the clock signal C.

A third time period 306 of the timing plot 300 occurs after $t_0$ and before $t_1$. Time $t_1$ is measured relative to the transition of the clock signal C. Because the input data D must be stable during reading, the data input D must be held constant through a specific point in time relative to the rising edge of the clock signal C to allow for accurate readings. The D flip-flop is latching a reliable steady-state signal of the data input D until $t_1$. The time period 306 is defined as an amount of time after the clock signal C transitions to a 1 but before the data input D can transition without degrading performance. During the time period 306 the clock signal C is depicted as a single value of 1 except at the beginning of the time period 306 when the clock signal C makes the second half of the transition to 1. In other embodiments, the clock signal may be a constant 0, or include at least one transition. Data output Q is shown as a constant value of either 1 or 0, as in the time period 306 the D flip-flop has latched the previous data input D and is still outputting that value. Time $t_1$ is also called hold time $t_h$, reflecting how this is the time relative to the rising edge of the clock signal C in which the D flip-flop input has to be held constant and stable for a reliable reading. In some embodiments hold time $t_h$ is positive, reflecting that the hold time $t_h$ occurs later in time than the rising edge of the clock signal C. In other embodiments, the hold time $t_h$ can be any value, including a negative value, reflecting that the hold time $t_h$ occurs earlier in time than the rising edge of the clock signal C.

A fourth time period 308 of the timing plot 300 occurs after $t_1$ but before $t_2$. Time $t_2$ is measured relative to the transition of the clock signal C. At $t_2$, the D flip-flop transitions to the data input D value present during the reading window between $t_{-1}$ and $t_1$. In other words, the D flip-flop has latched the new data input D. In other words, the D flip-flop has latched the data input D, and a change in the data input D at the input of the D flip-flop during time period 302 will not affect the performance of the D flip-flop. Thus, various values for data input D are depicted in the timing plot 300 at time period 308, with each X representing possible transitions in the data input D value that do not otherwise affect the data output Q of the D flip-flop. Since the time period 308 is defined as an amount of time after the clock signal C, the clock signal is depicted as a single value of 1 during the time period 308. In other embodiments, the clock signal may be a constant 0, or include at least one transition. Data output Q is shown as a constant value of either 1 or 0 until the end of the time period 308, when the data output Q makes the first half of a transition to reflect the data input D. Time $t_2$ is also called propagation delay $t_{pd}$, reflecting how this is the time relative to the rising edge of the clock signal C that it takes the D flip-flop to latch and output the data input D, or to propagate the signal through the circuit. The propagation delay $t_{pd}$ can be any positive value.

A fifth time period 310 of the timing plot 300 occurs after $t_2$. After $t_2$ the D flip-flop has reached a new steady state condition. At any point after $t_1$ the D flip-flop is not reading the data input D, thus various values for data input D are depicted in the timing plot 300 at time period 310 as well, with each X representing possible transitions in the data input D value that do not otherwise affect the data output Q of the D flip-flop, and the data input D has time to change and propagate to the needed components of the D flip-flop for the next reading window. In other words, the D flip-flop has finished latching the data input D, and a change in the data input D at the input of the D flip-flop during the time period 310 will not affect the performance of the D flip-flop. Additionally, after $t_2$ the data output Q has also stabilized, except at the beginning of the time period 310 when the data output Q makes the second half of the transition.

Figure 4A:
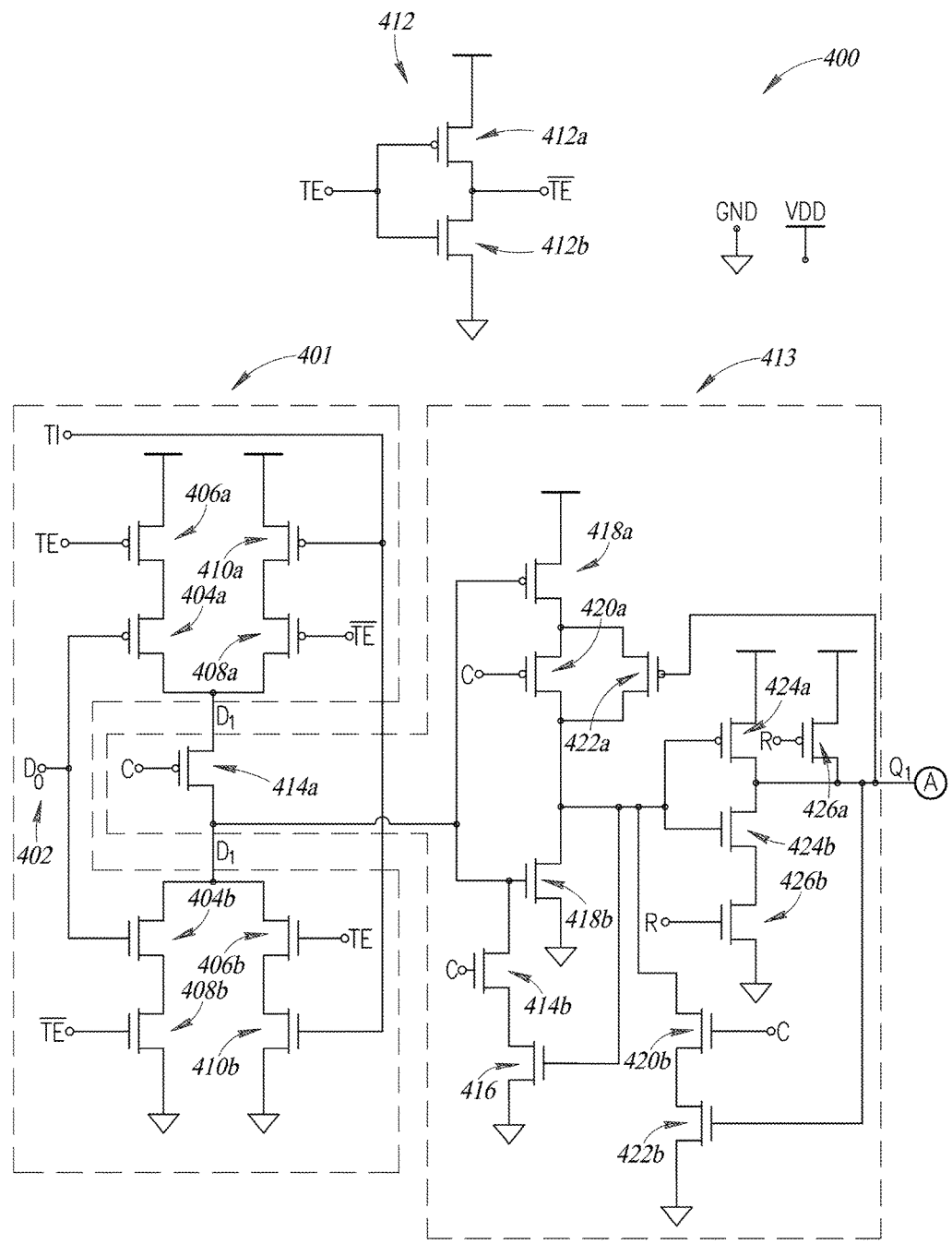
FIG. 4A is a schematic of a first half of a master-slave flip-flop, according to one embodiment.

FIG. 4A is a schematic of a first half of a master-slave flip-flop 400, according to one embodiment. FIGS. 4-5 include circuit diagrams at the transistor level of detail. The transistors are depicted as generic metal-oxide-semiconductor field-effect-transistors (MOSFETs); however, any specific type of transistor may be used. Additionally, the figures and description differentiate between p type MOSFETs (pMOS) and n type MOSFETs (nMOS); however, in other embodiments, any one of the pMOS transistors may be an nMOS transistor and any one of the nMOS transistors may be a pMOS transistor. The various transistors are enabled by the signals on the respective gates of those transistors, in one embodiment. In other embodiments, a transistor may be enabled by a signal on one or more terminals of the transistor.

The master-slave flip-flop 400 includes a test switch 401. The test switch 401 has a data input 402 ($D_0$) coupled to a gate of a pMOS transistor 404a and a gate of an nMOS transistor 404b. The pMOS transistor 404a has a terminal coupled to a terminal of a pMOS transistor 406a, and the nMOS transistor 404b has a terminal coupled to a terminal of an nMOS transistor 406b. The other terminals of the transistors 404a, 404b are coupled to outputs of the test switch 401, which are also inputs $D_1$ to a master latch 413. The other terminals of the transistors 406a, 406b are coupled to a high voltage line VDD and a low voltage line GND, respectively. The voltage line VDD can be a high signal, or a 1, in some embodiments, and the voltage line GND can be a low signal, or a 0, in some embodiments. The gate of the pMOS transistor 406a is coupled to a test enable signal TE, and the gate of the nMOS transistor 406b is coupled to an inverted test enable signal $\overline{TE}$. Thus, when the data input 402 is 0 and the test enable signal TE is 0, pMOS transistors 406a, 404a are conducting, and an output of the test switch 401 is equal to the voltage on the voltage line VDD. Conversely, when the data input 402 is 1 and the inverted test enable signal $\overline{TE}$ is 1, nMOS transistors 406b, 404b are conducting, and an output of the test switch 401 is equal to the voltage on the voltage line GND. In other combinations of inputs, the voltage lines are not coupled to the output of the test switch 401 through transistors 404a, 404b, 406a, 406b, isolating the data input 402 from the output of the test switch 401.

The test switch 401 has a test input TI coupled to a gate of a pMOS transistor 410a and a gate of an nMOS transistor 410b. The pMOS transistor 410a has a terminal coupled to a terminal of a pMOS transistor 408a and the nMOS transistor 410b has a terminal coupled to a terminal of an nMOS transistor 408b. The other terminals of the transistors 410a, 410b are coupled to voltage lines VDD, GND, respectively. The other terminals of the transistors 408a, 408b are coupled to an output of the test switch 401. The gate of the pMOS transistor 408a is coupled to the inverted test enable signal $\overline{TE}$, and the gate of the nMOS transistor 408b is coupled to the test enable signal TE. Thus, when the test input TI is 0 and the inverted test enable signal $\overline{TE}$ is 0, pMOS transistors 410a, 408a are conducting, and an output of the test switch 401 is equal to the voltage on the voltage line VDD. Conversely, when the test input TI is 1 and the test enable signal TE is 1, nMOS transistors 410b and 408b are conducting, and an output of the test switch 401 is equal to the voltage on the voltage line GND. In other combinations of inputs, the voltage lines are not coupled to the output of the test switch 401 through transistors 408a, 408b, 410a, 410b, isolating the test input TI from the output of the test switch 401.

The inverted test enable signal $\overline{TE}$ is generated by an inverter 412. The inverter 412 receives the test enable signal TE at gates of a pMOS transistor 412a and an nMOS transistor 412b. A first terminal of the pMOS transistor 412a is coupled to the voltage line VDD, and a first terminal of the nMOS transistor 412b is coupled to the voltage line GND. A second terminal of the transistors 412a, 412b are common, and are the output of the inverter 412 generating the inverted test enable signal $\overline{TE}$. When the test enable signal TE is 0, pMOS transistor 412a couples the inverter 412 output to the voltage line VDD, and when the test enable signal TE is 1, nMOS transistor 430b couples the inverter 412 output to the voltage line GND.

In some embodiments, the test switch 401 operates such that only one of the data input 402 and the test input TI control an output of the test switch 401. In both cases, the output signal is inverted from the received signal. The outputs of the test switch 401 are coupled to the inputs $D_1$ of the master latch 413. The outputs of the test switch 401 is shown as two separate nodes. In other embodiments, it may be any number of nodes greater than zero.

The master latch 413 includes a pass gate having a pMOS transistor 414a and an nMOS transistor 414b. The gates of the transistors 414a, 414b are coupled to a clock signal C. The pMOS transistor 414a has a terminal coupled to a first node of the input to the master latch 413, and has a terminal coupled to a second node of the input to the master latch 413. The nMOS transistor 414b has a terminal coupled to the second node of the input to the master latch 413. The other terminal of the nMOS transistor 414b is coupled to an nMOS transistor 416. In some embodiments, a clock signal C of 0 allows the test switch output to be received, and a clock signal C of 1 blocks the output of the test switch at the pass gate of transistors 414a, 414b.

The common node between transistors 414a, 414b is also coupled to the gates of an inverter that includes a pMOS transistor 418a and an nMOS transistor 418b. A first terminal of the pMOS transistor 418a is coupled to the voltage line VDD, and a first terminal of the nMOS transistor 418b is coupled to the voltage line GND. Second terminals of the transistors 418a, 418b are the output of the inverter.

The output of the inverter at the terminal of transistor 418b is also coupled to a gate of the nMOS transistor 416. The nMOS transistor 416 has a second terminal coupled to the voltage line GND. The nMOS transistor 416 works with the pass gate of transistors 414a, 414b to control the coupling of the test switch 401 to the master latch 413.

A pass gate having a pMOS transistor 420a and an nMOS transistor 420b is coupled to the output of the inverter with transistors 418a, 418b. The gates of the transistors 420a, 420b are coupled to a clock signal C. The pMOS transistor 420a has a terminal coupled to a terminal of the pMOS transistor 418a, and has a terminal coupled to a terminal of the nMOS transistor 418b. The nMOS transistor 420b has a terminal coupled to node between the pMOS transistor 420a and nMOS transistor 418b. In some embodiments, a clock signal C of 0 allows the output of the inverter with transistors 418a, 418b to be transmitted, and a clock signal C of 1 to float the output. Thus the pass gate of transistors 420a, 420b serve as a clock enable of the inverter of transistors 418a, 418b.

The common node between transistors 420a, 418b is also coupled to the gates of an inverter that includes a pMOS transistor 424a and an nMOS transistor 424b. A first terminal of the pMOS transistor 424a is coupled to the voltage line VDD. A common node of the transistors 424a, 424b is the output of the inverter. The node including the common node of the transistors 424a, 424b is also the output of the master latch 413, output $Q_1$ (node A for page break).

A pass gate having a pMOS transistor 426a and an nMOS transistor 426b is coupled to the output of the inverter with transistors 424a, 424b. The gates of the transistors 426a, 426b are coupled to a reset signal R. The pMOS transistor 426a has a terminal coupled to the voltage line VDD and has a terminal coupled to a node between transistors 424a, 424b. The nMOS transistor 426b has a terminal coupled to a terminal of the nMOS transistor 424b and a terminal coupled to the voltage line GND. In some embodiments, a reset signal R of 1 allows the output of the inverter with transistors 424a, 424b to be transmitted, and a reset signal R of 0 sets the output to the voltage of the voltage line VDD. Thus the pass gate of transistors 426a, 426b serve as a reset enable of the inverter of transistors 424a, 424b.

The common node between transistors 424a, 424b is also coupled to the gates of an inverter that includes a pMOS transistor 422a and an nMOS transistor 422b. A first terminal of the pMOS transistor 422a is coupled to a node between pMOS transistor 418a and pMOS transistor 420a. A second terminal of the pMOS transistor 422a is coupled to the node between pMOS transistor 420a and nMOS transistor 418b. A first terminal of the nMOS transistor 418b is coupled to the voltage line GND. A second terminal of the nMOS transistor 418b is coupled to a terminal of the transistor 420b. Thus the pass gate of transistors 420a, 420b serve as a clock enable of the inverter of transistors 422a, 422b. Additionally, as depicted, the inverter of transistors 422a, 422b provide a feedback loop of the master latch 413.

Figure 4B:
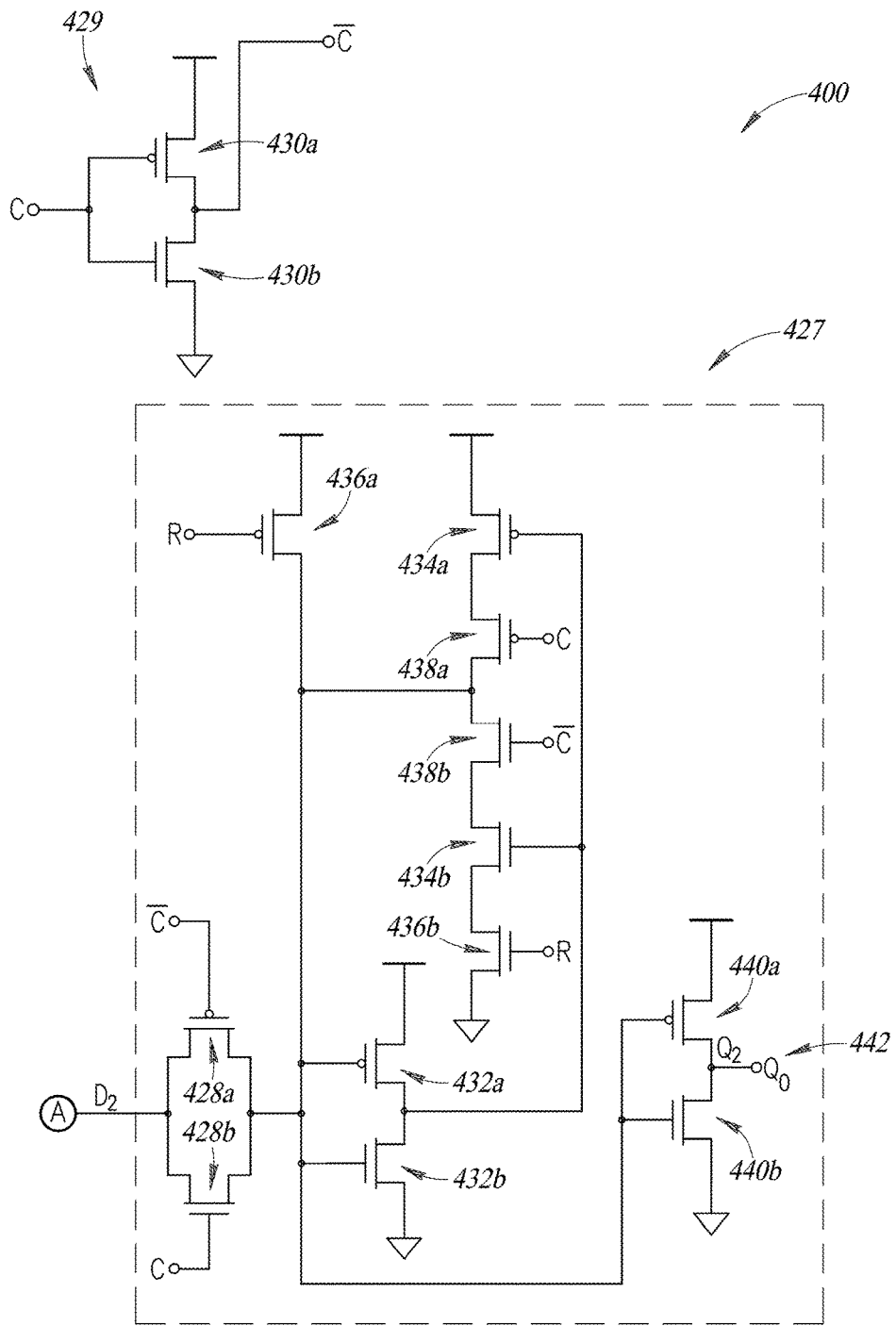
FIG. 4B is a schematic of a second half of the master-slave flip-flop of FIG. 4A.
Figure 5:
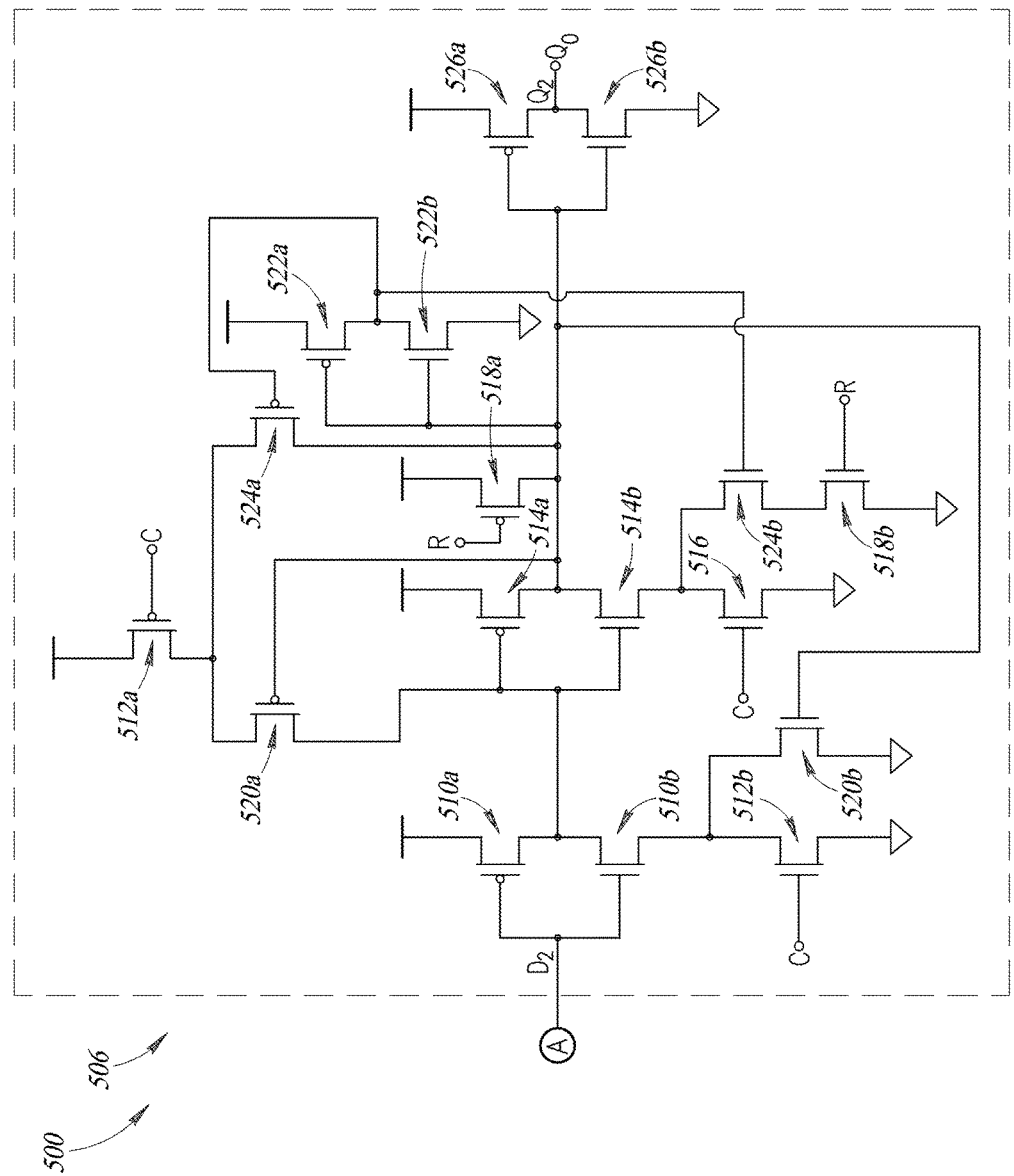
FIG. 5 is a schematic of a second half of a master-slave flip-flop, according to one embodiment.

FIG. 4B is a schematic of a second half of the master-slave flip-flop 400, including a slave latch 427. The slave latch 427 includes a pass gate having a pMOS transistor 428a and an nMOS transistor 428b. The gate of the transistor 428b is coupled to the clock signal C, and the gate of the transistor 428a is coupled to an inverted clock signal $\overline{C}$. The transistors have a common node coupled to an input of the slave latch 427, input $D_2$ (node A for page break), and have a common node as an output to the remainder of the slave latch 427. In some embodiments, a clock signal C of 0 and an inverted clock signal $\overline{C}$ of 1 uncouples the input $D_2$ from the slave latch 427, and a clock signal C of 1 and an inverted clock signal $\overline{C}$ of 0 couples the input $D_2$ to the slave latch 427.

The inverted clock signal $\overline{C}$ is generated by an inverter 429. The inverter 429 receives the clock signal C at gates of a pMOS transistor 430a and an nMOS transistor 430b. A first terminal of the pMOS transistor 430a is coupled to the voltage line VDD, and a first terminal of the nMOS transistor 430b is coupled to the voltage line GND. A second terminal of the transistors 430a, 430b are common and are the output of the inverter 429 generating the inverted clock signal $\overline{C}$. When the clock signal C is 0, pMOS transistor 430a couples the inverter 429 output to the voltage line VDD, and when the clock signal C is 1, nMOS transistor 430b couples the inverter 429 output to the voltage line GND.

The common node between transistors 428a, 428b is also coupled to the gates of an inverter that includes a pMOS transistor 432a and an nMOS transistor 432b. A first terminal of the pMOS transistor 432a is coupled to the voltage line VDD and a first terminal of the nMOS transistor 432b is coupled to the voltage line GND. Second terminals of the transistors 432a, 432b are the output of the inverter.

The common node between transistors 432a, 432b is also coupled to the gates of an inverter that includes a pMOS transistor 434a and an nMOS transistor 434b. As depicted, the inverter of transistors 434a, 434b provide a feedback loop of the slave latch 427.

A pass gate having a pMOS transistor 436a and an nMOS transistor 436b is coupled to the inverter with transistors 434a, 434b. The gates of the transistors 436a, 436b are coupled to a reset signal R. The pMOS transistor 436a has a terminal coupled to the voltage line VDD, and has a terminal coupled to a node between transistors 434a, 434b. The nMOS transistor 436b has a terminal coupled to a terminal of the nMOS transistor 434b, and a terminal coupled to the voltage line GND. In some embodiments, a reset signal R of 1 allows the output of the inverter with transistors 424a, 424b to be transmitted, and a reset signal R of 0 sets the output to the voltage of the voltage line VDD. Thus the pass gate of transistors 436a, 436b serve as a reset enable of the inverter of transistors 434a, 434b.

A pass gate having a pMOS transistor 438a and an nMOS transistor 438b is coupled to the output of the inverter with transistors 434a, 434b. The gates of the transistors 438a, 438b are coupled to the clock signal C and to the inverted clock signal $\overline{C}$, respectively. The pMOS transistor 438a has a terminal coupled to a terminal of the pMOS transistor 434a, and the nMOS transistor 438b has a terminal coupled to a terminal of the nMOS transistor 434b. The transistors 438a, 438b share a common node which is an output of the pass gate. In some embodiments, a clock signal C of 0 and an inverted clock signal $\overline{C}$ of 1 allows the output of the inverter with transistors 434a, 434b to be transmitted, and a clock signal C of 1 and an inverted clock signal $\overline{C}$ of 0 floats the output. Thus the pass gate of transistors 438a, 438b serve as a clock enable of the inverter of transistors 434a, 434b.

The common node between transistors 428a, 428b is also coupled to the gates of an inverter that includes a pMOS transistor 440a and an nMOS transistor 440b. A first terminal of the pMOS transistor 440a is coupled to the voltage line VDD. A first terminal of the nMOS transistor 440b is coupled to the voltage line GND. A common node of the transistors 440a, 440b is the output of the inverter. The common node of the transistors 440a, 440b is also an output $Q_2$ of the slave latch 427 and the master-slave flip-flop 400 as data output 442 ($Q_O$).

FIG. 5 is a schematic of a second half of a master-slave flip-flop 500, including a slave latch 506, according to one embodiment. The slave latch 506 can replace the slave latch 427 in the master-slave flip-flop 400 to generate a new embodiment.

The slave latch 506 receives an input $D_2$ at the gates of an inverter that includes a pMOS transistor 510a and an nMOS transistor 510b. A first terminal of the pMOS transistor 510a is coupled to the voltage line VDD. A second terminal of the transistors 510a, 510b is the output of the inverter.

The common node between transistors 510a, 510b is also coupled to the gates of an inverter that includes a pMOS transistor 514a and an nMOS transistor 514b. A first terminal of the pMOS transistor 514a is coupled to the voltage line VDD. A second terminal of the transistors 514a, 514b is the output of the inverter.

Coupled to the inverter having transistors 510a, 510b is a pass gate having a pMOS transistor 512a and an nMOS transistor 512b. The gates of the transistors 512a, 512b are coupled to a clock signal C. The pMOS transistor 512a has a terminal coupled to the voltage line VDD. The nMOS transistor 512b has a terminal coupled to the voltage line GND and a terminal coupled to a terminal of the nMOS transistor 510b. In some embodiments, a clock signal C of 1 allows the signal at node A to be received, and a clock signal C of 0 blocks the output of the inverter having transistors 510a, 510b. Thus the pass gate of transistors 512a, 512b serve as a clock enable of the inverter of transistors 510a, 510b.

The common node between transistors 514a, 514b is also coupled to the gates of an inverter that includes a pMOS transistor 520a and an nMOS transistor 520b. A first terminal of the pMOS transistor 520a is coupled to a terminal of the pMOS transistor 512a, and a second terminal is coupled to the common node between transistors 510a, 510b. A first terminal of the nMOS transistor 520b is coupled to the voltage line GND, and a second terminal is coupled to a terminal of the nMOS transistor 510b. The second terminals of the transistors 520a, 520b are the output of the inverter. Additionally, as depicted, the inverter of transistors 520a, 520b provide a first feedback loop of the slave latch 506.

Coupled to the inverter having transistors 510a, 510b is a pass gate having the pMOS transistor 512a and an nMOS transistor 516. The gate of the transistor 516 is coupled to a clock signal C. The nMOS transistor 516 has a terminal coupled to the voltage line GND and a terminal coupled to a terminal of the nMOS transistor 514b. In some embodiments, a clock signal C of 1 allows the signal at the common node between transistors 510a, 510b to be received, and a clock signal C of 0 blocks the output of the inverter having transistors 514a, 514b. Thus the pass gate of transistors 512a, 516 serve as a clock enable of the inverter of transistors 514a, 514b.

The common node between transistors 514a, 514b is also coupled to the gates of an inverter that includes a pMOS transistor 522a and an nMOS transistor 522b. A first terminal of the pMOS transistor 522a is coupled to the voltage line VDD. A first terminal of the nMOS transistor 522b is coupled to the voltage line GND. A second terminal of the transistors 522a, 522b is the output of the inverter.

The common node between transistors 522a, 522b is also coupled to the gates of an inverter that includes a pMOS transistor 524a and an nMOS transistor 524b. A first terminal of the pMOS transistor 524a is coupled to a common node between the pMOS transistor 512a and pMOS transistor 520a. A second terminal of the pMOS transistor 524a is coupled to the common node between transistors 514a, 514b. A first terminal of the nMOS transistor 524b is coupled to a node between nMOS transistor 516 and nMOS transistor 514b. A second terminal of the transistors 524a, 524b is the output of the inverter. Additionally, as depicted, the inverter of transistors 524a, 524b provide a second feedback loop of the slave latch 506.

Coupled to the inverter having transistors 524a, 524b is a pass gate having a pMOS transistor 518a and an nMOS transistor 518b. The gates of the transistors 518a, 518b are coupled to a reset signal R. The pMOS transistor 518a has a terminal coupled to the voltage line VDD and a terminal coupled to the common node between transistors 514a, 514b. The nMOS transistor 518b has a terminal coupled to the voltage line GND and a terminal coupled to a terminal of the nMOS transistor 524b. In some embodiments, a reset signal R of 1 allows the second feedback loop to be a closed circuit, and a reset signal R of 0 blocks the output of the inverter having transistors 514a, 514b and forces the output of the inverter to the voltage of the voltage line VDD. Thus the pass gate of transistors 518a, 518b serve as a reset enable of the inverter of transistors 514a, 514b.

The common node between transistors 514a, 514b is also coupled to the gates of an inverter that includes a pMOS transistor 526a and an nMOS transistor 526b. A first terminal of the pMOS transistor 526a is coupled to the voltage line VDD and a first terminal of the nMOS transistor 526b is coupled to the voltage line GND. A second terminal of the transistors 526a, 526b is the output of the inverter. The node including the common terminal of the transistors 526a, 526b is also an output $Q_2$ of the slave latch 506, which is the data output $Q_0$ of the master-slave flip-flop 500.

Some of the embodiments discussed throughout have been shown to improve nominal hold viability and robustness at low voltages without an increase in circuit area or dynamic power, as compared to previous designs. Specifically, previous designs 1, 2, 3 (leftmost column of Table 3) have been compared to a 4th design representative of an embodiment discussed above. The designs 1, 3, 4 each have an area of 5.67 um$^2$. The design 2 has an area of 5.8968 um$^2$ which is 1.04 times the area of the designs 1, 3, 4. The Exemplary simulation data is discussed below.

Table 3 illustrates simulation data for the designs 1, 2, 3, 4. For the test simulation, the voltage differential between voltage lines VDD, GND is 0.81V, and the temperature of the circuit is 40 degrees C. The clock signal has a 250 ps slew and the input data has a 50 ps slew. Values in the table are picoseconds (ps). The table illustrates that design 4 has the best overall nominal hold performance, as hold rise and hold fall are both high negative values. Referring to FIG. 3, this means that the hold time ends well before the clock signal C transitions. Additionally, Table 3 illustrates the best overall hold margin with both hold margins being high values. The hold margins are the amount of time from $t_{-1}$ to $t_2$ minus the amount of time between $t_{-1}$ to $t_1$. In more plain terms, for a given total time from holding the data input D to getting a data output Q, the largest portion of that time does not require a hold on the data input D. Lastly, the setup plus hold fall time is improved over previous designs by reducing the value, meaning the window required to hold the data input constant is reduced.

TABLE 3

| | Delay Rise | Delay Fall | Setup Rise | Setup Fall | Hold Rise | Hold Fall | D + S Rise | D + S Fall | Hold Margin Rise | Hold Margin Fall | Setup + Hold Rise | Setup + Hold Fall |
|---|---|---|---|---|---|---|---|---|---|---|---|---|
| 1 | 2027 | 1757 | 1240 | 677 | −798 | 65 | 3267 | 2434 | 2825 | 1692 | 442 | 742 |
| 2 | 1934 | 1384 | 1067 | 1117 | 35 | −430 | 3002 | 2501 | 1899 | 1815 | 1103 | 687 |
| 3 | 1409 | 1415 | 940 | 831 | −423 | −123 | 2349 | 2245 | 1832 | 1537 | 518 | 708 |
| 4 | 1485 | 1261 | 1523 | 946 | −765 | −729 | 3008 | 2208 | 2249 | 1991 | 758 | 217 |

Table 4 illustrates simulation data for the designs 1, 2, 3, 4. For the test simulation, the voltage differential between voltage lines VDD, GND is 0.7V, and the temperature of the circuit is 40 degrees C. The clock signal has a 250 ps slew and the input data has a 50 ps slew. Values in the table are ps. The table illustrates that design 4 has the best overall nominal hold performance, as hold rise and hold fall are both high negative values. Additionally, Table 3 illustrates the best overall hold margin with both hold margins being high values. Lastly, the setup plus hold fall time is improved over previous designs by reducing the value.

TABLE 4

| | Delay Rise | Delay Fall | Setup Rise | Setup Fall | Hold Rise | Hold Fall | D + S Rise | D + S Fall | Hold Margin Rise | Hold Margin Fall | Setup + Hold Rise | Setup + Hold Fall |
|---|---|---|---|---|---|---|---|---|---|---|---|---|
| 1 | 7536 | 5424 | 6444 | 2597 | −4341 | 118 | 13980 | 8021 | 11877 | 5306 | 2102 | 2715 |
| 2 | 5767 | 4506 | 4660 | 3414 | −296 | −871 | 10427 | 7920 | 6063 | 5377 | 4364 | 2543 |
| 3 | 4508 | 4098 | 4291 | 3210 | −2173 | −776 | 8800 | 7307 | 6682 | 4873 | 2118 | 2434 |
| 4 | 5816 | 3707 | 6503 | 2742 | −2436 | −1988 | 12319 | 6449 | 8252 | 5694 | 4067 | 754 |

Table 5 illustrates simulation data for the designs 1, 2, 3, 4. For the test simulation, the voltage differential between voltage lines VDD, GND is 1.2V, and the temperature of the circuit is 25 degrees C. The clock signal has a 250 ps slew and the input data has a 50 ps slew. Values in the table are ps. The table illustrates that design 4 has the best overall nominal hold performance, as hold rise and hold fall are both the most negative values. Additionally, Table 3 illustrates the best overall hold margin with both hold margins being high values. Lastly, the setup plus hold times are both improved over previous designs by reducing the value.

TABLE 5

| | Delay Rise | Delay Fall | Setup Rise | Setup Fall | Hold Rise | Hold Fall | D + S Rise | D + S Fall | Hold Margin Rise | Hold Margin Fall | Setup + Hold Rise | Setup + Hold Fall |
|---|---|---|---|---|---|---|---|---|---|---|---|---|
| 1 | 321 | 319 | 44 | −1 | −29 | 55 | 365 | 318 | 350 | 264 | 15 | 54 |
| 2 | 322 | 246 | 40 | 207 | 24 | −162 | 362 | 454 | 297 | 408 | 65 | 45 |
| 3 | 250 | 255 | 41 | 43 | −23 | 22 | 291 | 297 | 273 | 233 | 18 | 65 |
| 4 | 243 | 239 | 201 | 179 | −162 | −162 | 444 | 418 | 405 | 401 | 39 | 17 |

Table 6 illustrates simulation data for the designs 1, 2, 3, 4. For the test simulation, the voltage differential between voltage lines VDD, GND is varied, as expressed in the table. Values in the table are ps. The table illustrates that design 4 has the best overall nominal hold performance, as hold rise and hold fall are together the most negative values.

TABLE 6

| | VDD | Delay Rise | Delay Fall | Setup Rise | Setup Fall | Hold Rise | Hold Fall |
|---|---|---|---|---|---|---|---|
| 1 | 0.6 | 65612 | 37273 | 60339 | 12391 | −41174 | 6438 |
| 1 | 0.7 | 9164 | 7049 | 5025 | 766 | −3259 | 1729 |
| 1 | 0.81 | 3270 | 2988 | 511 | −713 | −120 | 1268 |
| 2 | 0.6 | 33879 | 33071 | 35246 | 20555 | −2290 | −4230 |
| 2 | 0.7 | 7191 | 5926 | 3342 | 3871 | 691 | −1518 |
| 2 | 0.81 | 2964 | 2493 | 45 | 1601 | 722 | −987 |
| 3 | 0.6 | 33359 | 24880 | 32246 | 19443 | −17829 | −2583 |
| 3 | 0.7 | 5935 | 5476 | 2927 | 1796 | −1335 | 736 |

TABLE 6-continued

| | VDD | Delay Rise | Delay Fall | Setup Rise | Setup Fall | Hold Rise | Hold Fall |
|---|---|---|---|---|---|---|---|
| 3 | 0.81 | 2436 | 2410 | 168 | −281 | 167 | 872 |
| 4 | 0.6 | 51532 | 24105 | 52623 | 14427 | −18260 | −10657 |
| 4 | 0.7 | 6799 | 5206 | 5815 | 3189 | −3121 | −2553 |
| 4 | 0.81 | 2455 | 2333 | 1860 | 1458 | −1277 | −1262 |

In addition to timing data, Applicant has generated power simulation data. Table 7 provides cap power, and Tables 8-10 provide dynamic power, which is cap power plus internal power. Tables 8-10 provide power values for transitioning a data signal, holding a high signal, or holding a low signal through a clock signal, respectively. For the test simulation, the voltage differential between voltage lines VDD, GND is 1.26V and the temperature of the circuit is 130 degrees C. The clock signal has a 250 ps slew and the input data has a 50 ps slew. Values in the table are watts unless otherwise indicated.

TABLE 7

| | CP_R | CP_F | CP_Avg | CV2 | CV2F (200 MHZ) | CV2F uA (200 MHZ) | % Increase |
|---|---|---|---|---|---|---|---|
| 1 | 6.46E−16 | 6.38E−16 | 6.42E−16 | 1.02E−15 | 2.04E−07 | 0.204 | REF |
| 2 | 1.68E−15 | 1.64E−15 | 1.66E−15 | 2.63E−15 | 5.27E−07 | 0.527 | 158 |
| 3 | 1.02E−15 | 9.88E−16 | 1.00E−15 | 1.59E−15 | 3.18E−07 | 0.318 | 56 |
| 4 | 2.39E−15 | 2.39E−15 | 2.39E−15 | 3.79E−15 | 7.59E−07 | 0.759 | 272 |

TABLE 8

| | D_10Act_CP_Toggle | CV2F uA (200 MHZ) | Total Power | % increase |
|---|---|---|---|---|
| 1 | 1.4446 | 0.204 | 1.649 | REF |
| 2 | 0.97459 | 0.527 | 1.502 | −9 |
| 3 | 1.7675 | 0.318 | 2.086 | 27 |
| 4 | 0.8055 | 0.759 | 1.565 | −5 |

TABLE 9

| | D_Stuck0_CP_Toggle | CV2F uA (200 MHZ) | Total Power | % increase |
|---|---|---|---|---|
| 1 | 1.3021 | 0.204 | 1.506 | REF |
| 2 | 1.6048 | 0.318 | 1.923 | 28 |
| 3 | 0.79827 | 0.527 | 1.325 | −12 |
| 4 | 0.61444 | 0.759 | 1.373 | −9 |

TABLE 10

| | D_Stuck1_CP_Toggle | CV2F uA (200 MHZ) | Total Power | % increase |
|---|---|---|---|---|
| 1 | 1.2941 | 0.204 | 1.498 | |
| 2 | 1.5975 | 0.318 | 1.916 | 28 |
| 3 | 0.81427 | 0.527 | 1.341 | −10 |
| 4 | 0.61146 | 0.759 | 1.37 | −9 |

Tables 11 and 12 illustrate simulation data for the designs 1, 2, 3, 4 including 3 sigma data. Manufacturing variations in the circuit will cause timing to not be a precise value. The 3 sigma data represents the values to be accurate for 99.7% of timing values. For the test simulation in Table 11, the voltage differential between voltage lines VDD, GND is 0.81V and the temperature of the circuit is 40 degrees C. The simulation was run over 2000 iterations with expected circuit variations. The clock signal has a 1500 ps slew and the input data has a 50 ps slew. Values in the table are ps. The table illustrates that design 4 has the best overall 3 sigma nominal hold performance, as hold rise and hold fall are both high negative values. Additionally, Table 3 illustrates the best overall 3 sigma hold margins with both hold margins being high values.

TABLE 11

| | | Delay Rise | Delay Fall | Hold Rise | Hold Fall | Hold Margin Rise | Hold Margin Fall |
|---|---|---|---|---|---|---|---|
| 1 | Nominal | 3373 | 3045 | −219 | 1244 | | |
| | Nominal + 3 sigma (Hold) | 2320 | 2076 | 855 | 2873 | 1465 | −797 |
| | Nominal − 3 sigma (Delay) | | | | | | |
| 3 | Nominal | 2452 | 2424 | 116 | 846 | | |
| | Nominal + 3 sigma (Hold) | 2023 | 1944 | 485 | 1278 | 1538 | 666 |
| | Nominal − 3 sigma (Delay) | | | | | | |
| 2 | Nominal | 3009 | 2537 | 707 | −978 | | |
| | Nominal + 3 sigma (Hold) | 2466 | 1838 | 1136 | −615 | 1330 | 2453 |
| | Nominal − 3 sigma (Delay) | | | | | | |
| 4 | Nominal | 2506 | 2362 | −1300 | −1269 | | |
| | Nominal + 3 sigma (Hold) | 1864 | 1810 | −940 | −987 | 2804 | 2797 |
| | Nominal − 3 sigma (Delay) | | | | | | |

For the test simulation in Table 12, the voltage differential between voltage lines VDD, GND is 0.70V and the temperature of the circuit is 40 degrees C. The simulation was run over 2000 iterations with expected circuit variations. The clock signal has a 1500 ps slew and the input data has a 50 ps slew. Values in the table are ps. The table illustrates that design 4 has the best overall 3 sigma nominal hold performance, as hold rise and hold fall are both high negative values. Additionally, Table 3 illustrates the best overall 3 sigma hold margins with both hold margins being high values.

| | | Delay Rise | Delay Fall | Hold Rise | Hold Fall | Hold Margin Rise | Hold Margin Fall |
|---|---|---|---|---|---|---|---|
| 2 | Nominal | 7516 | 6252 | 644 | −1537 | | |
| | Nominal + 3 sigma (Hold) | 5161 | 3459 | 1706 | −907 | 3455 | 4366 |
| | Nominal − 3 sigma (Delay) | | | | | | |
| 3 | Nominal | 6149 | 5643 | −1539 | 608 | | |
| | Nominal + 3 sigma (Hold) | 3860 | 3636 | 48 | 2003 | 3812 | 1633 |
| | Nominal − 3 sigma (Delay) | | | | | | |
| 4 | Nominal | 7294 | 5383 | −3261 | −2604 | | |
| | Nominal + 3 sigma (Hold) | 3544 | 3376 | −1665 | −1833 | 5209 | 5209 |
| | Nominal − 3 sigma (Delay) | | | | | | |

The embodiment shown in FIG. 5 has a 16% increase in area, but reduces dynamic power by 50% while maintaining the same functionality as compared to design 4.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A device, comprising:
    a master-slave flip-flop memory circuit including:
        a master latch including:
            a first inverter coupled to an input of the master latch, the first inverter including:
                a first transistor having a gate directly coupled to the input of the master latch and a first terminal directly coupled to a high voltage line;
                a second transistor having a gate directly coupled to the input of the master latch, a first terminal directly coupled to a low voltage line, and a second terminal coupled to a second terminal of the first transistor; and
                a third transistor having a gate coupled to a clock input, a first terminal directly coupled to the input of the master latch, and a second terminal coupled to the low voltage line;
            a second inverter having an input coupled to an output of the first inverter and having an output coupled to an output of the master latch; and
            a third inverter having an input coupled to the output of the second inverter and having an output coupled to the input of the second inverter; and
        a slave latch coupled to the master latch.

2. The device of claim 1 wherein the first inverter is clock enabled by a low clock signal on the clock input.

3. The device of claim 1 wherein the third inverter is clock enabled by a low clock signal.

4. The device of claim 3 wherein the second inverter is reset enabled by a high reset signal.

5. The device of claim 1 wherein the second inverter is reset enabled.

6. The device of claim 1 wherein the slave latch includes:
    a first inverter having an input coupled to an input of the slave latch;
    a second inverter having an input coupled to the input of the first inverter of the slave latch and having an output coupled to an output of the slave latch; and
    a third inverter having an input coupled to the output of the first inverter of the slave latch and having an output coupled to the input of the first inverter of the slave latch.

7. A device, comprising:
    a master-slave flip-flop including:
        a master latch including:
            a data input;
            a clock input;
            a high voltage line;
            a low voltage line;
            a first transistor having a gate directly coupled to the data input and a first terminal directly coupled to the high voltage line;
            a second transistor having a gate directly coupled to the data input, a first terminal directly coupled to the low voltage line, and a second terminal coupled to a second terminal of the first transistor; and
            a third transistor having a gate directly coupled to the clock input, a first terminal directly coupled to the data input, and a second terminal coupled to the low voltage line.

8. The device of claim 7 wherein the first transistor and the second transistor form a first inverter.

9. The device of claim 7, further comprising:
    a fourth transistor having a gate directly coupled to the second terminal of the second transistor and a first terminal directly coupled to the high voltage line; and
    a fifth transistor having a gate directly coupled to the second terminal of the second transistor, a first terminal coupled to the low voltage line, and a second terminal directly coupled to a second terminal of the fourth transistor.

10. The device of claim 9, further comprising:
    a sixth transistor having a gate directly coupled to the second terminal of the fourth transistor and a first terminal coupled to the high voltage line; and
    a seventh transistor having a gate directly coupled to the second terminal of the fourth transistor, a first terminal directly coupled to the low voltage line, and a second terminal coupled to a second terminal of the sixth transistor and coupled to the gate of the fifth transistor.

11. The device of claim 10 wherein the first transistor and the second transistor form a first inverter, the fourth transistor and the fifth transistor form a second inverter, and the sixth transistor and the seventh transistor form a third inverter, the first, second, and third inverters forming the master latch.

12. The device of claim 9, further comprising:
    a sixth transistor having a gate directly coupled to a reset input, a first terminal directly coupled to the high voltage line, and a second terminal directly coupled to the second terminal of the fourth transistor; and
    a seventh transistor having a gate directly coupled to the reset input, a first terminal directly coupled to the low voltage line, and a second terminal coupled to the second terminal of the sixth transistor.

13. The device of claim 7, further comprising:
    a fourth transistor having a gate coupled to a second terminal of the second transistor, a first terminal coupled to the low voltage line, and a second terminal coupled to the gate of the second transistor.

14. The device of claim 7, further comprising:
    a fourth transistor having a gate directly coupled to the clock input, a first terminal coupled to the high voltage line, and a second terminal coupled to the gate of the second transistor; and
    a fifth transistor having a gate directly coupled to the clock input, a first terminal coupled to the gate of the second transistor, and a second terminal coupled to the low voltage line.

15. A method, comprising:
    forming a master latch and a slave latch coupled to the master latch, the forming the master latch including:
        forming a first inverter coupled to an input of the master latch, the forming the first inverter including:

forming a first transistor having a gate directly coupled to the input of the master latch and a first terminal directly coupled to a high voltage line;

forming a second transistor having a gate directly coupled to the input of the master latch, a first terminal directly coupled to a low voltage line, and a second terminal coupled to a second terminal of the first transistor; and forming a third transistor having a gate coupled to a clock input and having first and second terminals coupled between the gate of the second transistor and the low voltage line;

forming a second inverter having an input coupled to an output of the first inverter and having an output coupled to an output of the master latch;

forming a third inverter having an input coupled to the output of the second inverter and having an output coupled to the input of the second inverter.

16. The method of claim 15 wherein forming the first inverter includes:

forming a clock enable circuit configured to enable the first inverter in response to the clock enable circuit receiving a low clock signal.

\* \* \* \* \*